United States Patent
Pham et al.

[19]

[11] Patent Number: 6,012,600
[45] Date of Patent: Jan. 11, 2000

[54] PRESSURE RESPONSIVE CLAMP FOR A PROCESSING CHAMBER

[75] Inventors: Thanh Pham, San Jose; Eugene Fukshansky, Mountain View; David Wanamaker, San Jose, all of Calif.

[73] Assignee: Applied Materials, Inc., Santa Clara, Calif.

[21] Appl. No.: 08/590,030

[22] Filed: Feb. 2, 1996

[51] Int. Cl.[7] .................................................. B65D 45/18
[52] U.S. Cl. ...................................... 220/203.1; 220/326
[58] Field of Search .................................... 220/326, 325, 220/203.1, 203.01

[56] References Cited

U.S. PATENT DOCUMENTS

| | | | |
|---|---|---|---|
| 2,380,443 | 7/1945 | Ingle | 220/326 |
| 2,501,526 | 3/1950 | Laucks | 220/326 |
| 4,149,650 | 4/1979 | Whelchel et al. | 220/326 |
| 4,190,155 | 2/1980 | Hisley | 220/326 |
| 4,372,921 | 2/1983 | Sanderson et al. | 220/203.01 |
| 4,501,378 | 2/1985 | Berfield | 220/326 |
| 4,556,150 | 12/1985 | Ikumi | 220/326 |
| 4,589,567 | 5/1986 | Pircher | 220/326 |
| 5,065,885 | 11/1991 | Scaroni | 220/326 |
| 5,232,116 | 8/1993 | Baxter | 220/326 |
| 5,301,829 | 4/1994 | Chrisco | 220/326 |
| 5,332,131 | 7/1994 | Pehr | 220/326 |
| 5,348,185 | 9/1994 | Buckner III et al. | 220/326 |
| 5,657,892 | 8/1997 | Bolli et al. | 220/326 |

FOREIGN PATENT DOCUMENTS

| | | | |
|---|---|---|---|
| 2358777 | 7/1974 | Germany | 220/203.01 |

*Primary Examiner*—Joseph M. Moy
*Attorney, Agent, or Firm*—Thomason, Moser & Patterson

[57] ABSTRACT

A method and apparatus is provided which secures the lid of a processing chamber in abutting engagement with the walls of the chamber to form an airtight processing environment and which provides for the release of pressure within the chamber in the event of a sudden change in pressure such as an over pressure excursion. The method and apparatus generally comprise a clamp member having a base portion for mounting the clamp to a first surface, a contact portion for contacting a second surface and maintaining a desired relationship between the first and second surfaces, and a deflecting portion which allows separation of the first and second surfaces to relieve pressure behind the first or second surface and return to the desired relationship between the first and second surfaces.

18 Claims, 7 Drawing Sheets

PRESSURE RESPONSIVE CLAMP FOR A PROCESSING CHAMBER

BACKGROUND OF THE INVENTION

1. Field of the Invention

The present invention relates to a method and apparatus for releasably securing a first surface in a sealed relationship with a second surface. More particularly, the present invention provides a method and apparatus for releasably securing the cover of a processing chamber in a sealed relationship with the chamber walls and for regulating high end pressure within the chamber. More particularly still, the present invention provides a pressure responsive fastener which operates as a chamber cover restraint and as a pressure relief mechanism in the event of a sudden increase in pressure within the chamber.

2. Background of the Related Art

Fabrication of integrated circuit structures on semiconductor substrates is generally carried out in processing chambers which typically operate at low pressures. One example of a low pressure process is the deposition of a dielectric film in a subatmospheric chemical deposition (SACVD) chamber. Typically, a processing chamber includes a chamber wall having a lid hingedly attached to the upper edge of the chamber walls. The hinged lid enables access to the chamber components to facilitate repair and cleaning of the chamber, while preserving alignment of the lid with the sealing surfaces of the chamber. The lid of the chamber is lowered onto the chamber walls and the pressure within the chamber is lowered by various types of vacuum pumps. The chamber lid forms a sealed relationship with the chamber walls under the vacuum pressure within the chamber to form an evacuable enclosure.

Substrate processing within a system is typically carried out without interruption for several days before routine maintenance and cleaning of the system must be performed. The lid of the chamber in the system is secured in sealed, abutting engagement with the chamber walls to provide a vacuum environment that can be pumped down so that the fabrication processes can be carried out at a subatmospheric pressure. Clamping members are typically employed to fasten the lid in abutting engagement with the chamber walls, while permitting the lid to be periodically opened to provide access to the chamber.

The mating surfaces of the cover and chamber walls are typically prepared with machined surfaces with tight tolerances to form a seal around the perimeter of the cover. An O-ring type gasket is commonly disposed between the opposing lid and chamber sealing surfaces to provide an airtight seal despite minor variations in the opposing surfaces. The vacuum pressure within the chamber acts on the lid to pull the lid downward against the chamber walls and O-ring disposed therebetween to form an airtight seal between the lid and chamber walls and prevent air from leaking into the processing chamber.

The processing environment typically existing within the chamber is maintained at low pressure and returned to atmosphere prior to routine maintenance. However, pressure within the chamber may rise to levels at or above atmospheric pressure. It would be desirable to controllably release pressure within the chamber if the pressure reaches an undesirable level. Clamps presently used to secure the lid to the chamber walls are not pressure responsive and cannot vent the chamber should the pressure within the chamber suddenly increase. Presently available fasteners used in subatmospheric applications must be checked for any damage and the springs or the fasteners replaced if a pressure excursion occurs. Inspection and repair are time consuming and costly because the system must be shut down, inspection and repair completed, and then the system must again be pumped down to the processing pressure.

In addition to functional limitations, clamps presently available are costly and difficult to manufacture. One example of a clamp utilizes a tension spring having a first end secured to the exterior of the chamber wall and a second end having a clasp that is connectable with a hook located on the lid. Regardless of the exact means for securing the spring ends, it should be noted that the spring must be maintained in tension during normal operation of the chamber in order to maintain the lid in sealed relationship with the chamber walls. The tension placed on the spring manually by the operator each time the cover is closed and during operation compromises the integrity of the springs. An increase in chamber pressure typically results in plastic deformation of the springs thereby requiring replacement. Furthermore, the repeated application and removal of tension on the spring over a period of time, i.e. repeated opening of the chamber, may compromise the integrity of the spring.

Therefore, there exits a need for a pressure responsive fastener for a semiconductor processing chamber which facilitates release of pressure within the chamber to prevent damage to the chamber or components within the chamber. After the pressure has been released, the fastener would preferably return the lid to the sealed position so that processing may resume. It would be desirable to have a fastener that is simple to construct and operate, small, light weight and inexpensive to manufacture. Furthermore, it would be desirable to have a clamp with no moving parts and made from materials that will not release contaminants into a clean room environment.

SUMMARY OF THE INVENTION

The present invention provides a safety clamp for use in semiconductor processing chambers to secure the chamber lid in a closed position. The clamp also provides for release of pressure within the chamber in the event that an explosion or the like occurs or any sudden increase in chamber pressure.

The clamp is preferably a pressure responsive clamp, which clamps the cover to the chamber walls at a first chamber pressure, preferably such that the cover and the walls are engaged in an abutting relationship to provide a sealed chamber, wherein at least one portion of the cover and walls is disengaged at a second chamber pressure.

An apparatus for releasably securing at least two surfaces in a spaced relationship, comprising:
- a base portion for disconnectably connecting the apparatus to a first surface;
- a contact portion for contacting a second surface to locate said second surface in spaced relationship with said first surface; and
- a deflectable portion disposed between the base portion and the contact portion to provide controlled separation of said first and second surfaces.

An apparatus for securing a cover on a processing chamber, comprising:
- a) a hinge member coupling the cover to the processing chamber; and
- b) at least one spring positioned along an edge of the cover and spaced from the hinge member, the spring comprising:

i) a base portion for disconnectably fastening the spring to an exterior surface of the processing chamber;

ii) a cover contacting portion for securing the cover to the chamber in; and iii) a deflectable portion disposed between the base portion and the cover contacting portion.

A semiconductor processing apparatus, comprising:

a processing chamber having an opening therein;

a cover for sealing the opening;

a clamp disconnectably connecting the cover to the opening, the clamp comprising:

i) a base portion having a fastener for disconnectably connecting the base portion to an exterior surface of the processing chamber;

ii) a cover contacting portion for securing the cover to the chamber; and iii) a deflectable portion disposed between the base portion and the cover contacting portion, wherein the base portion, cover contacting portion and deflectable portion form a unitary structure.

A fastener for securing a first surface in a desired relation to a second surface, comprising:

a) a base portion contactable with a first surface;

b) a contact portion contactable with a second surface; and c) a resilient portion disposed between the base portion and the contact portion wherein the fastener has a first fastening position wherein the first and second surfaces are disposed in an abutting relationship, and upon the application of a predetermined force exerted within the chamber, the second surface is displaced from the abutting relationship with the first surface to permit the release of the pressure within the chamber.

A method of controlling regulating pressure within a processing chamber, comprising:

a) providing hinged attachment of a camber lid to the processing chamber along one side of the chamber; and b) attaching at least one spring clamp between the processing chamber and the chamber cover at a position opposite the hinged attachment of the cover to provide displacement of at least a portion of the chamber cover from the processing chamber to vent pressure within the chamber.

DESCRIPTION OF THE DRAWINGS

So that the manner in which the above recited features, advantages and objects of the present invention are attained and can be understood in detail, a more particular description of the invention, briefly summarized above, may be had by reference to the embodiments thereof which are illustrated in the appended drawings.

It is to be noted, however, that the appended drawings illustrate only typical embodiments of this invention and are therefor not to be considered limiting of its scope, for the invention may admit to other equally effective embodiments.

DETAILED DESCRIPTION OF A PREFERRED EMBODIMENT

The present invention generally provides a method and apparatus for releasably fastening a first surface in an abutting relationship with a second surface up to a first pressure and then enabling the first and second surfaces to separate at a second pressure, preferably until the pressure causing the separation returns to an acceptable range. In a preferred embodiment, the first and second surfaces are engaged in abutting relationship at a first chamber pressure and disengaged at a second chamber pressure. Preferably, the method and apparatus are practiced in connection with semiconductor processing equipment, namely semiconductor processing chambers. In one embodiment, the method and apparatus comprise a pressure responsive fastener which secures the lid of a processing chamber in an abutting relationship with the walls of the chamber to form an airtight evacuable enclosure and which provides for the release of pressure within the chamber in the event of a sudden increase in pressure during operation, i.e., an over pressure excursion. The fastener of the present invention is preferably designed to withstand a force of about 1300 lbs. without residual plastic deformation of the fastener. The invention is useful for any type of vacuum deposition chamber for semiconductor fabrication, such as a physical vapor deposition (PVD) chamber or a chemical vapor deposition (CVD) chamber for depositing a conductor, semiconductor or dielectric film on a substrates. The invention will be described below in a preferred implementation within a conventional sub-atmospheric chemical vapor deposition (SACVD) chamber for depositing a dielectric film on a semiconductor substrate. Before describing the features of the invention, the conventional components of the SACVD chamber and the fabrication process occurring therein are described.

Operation of an SACVD Chamber

Figure 1:
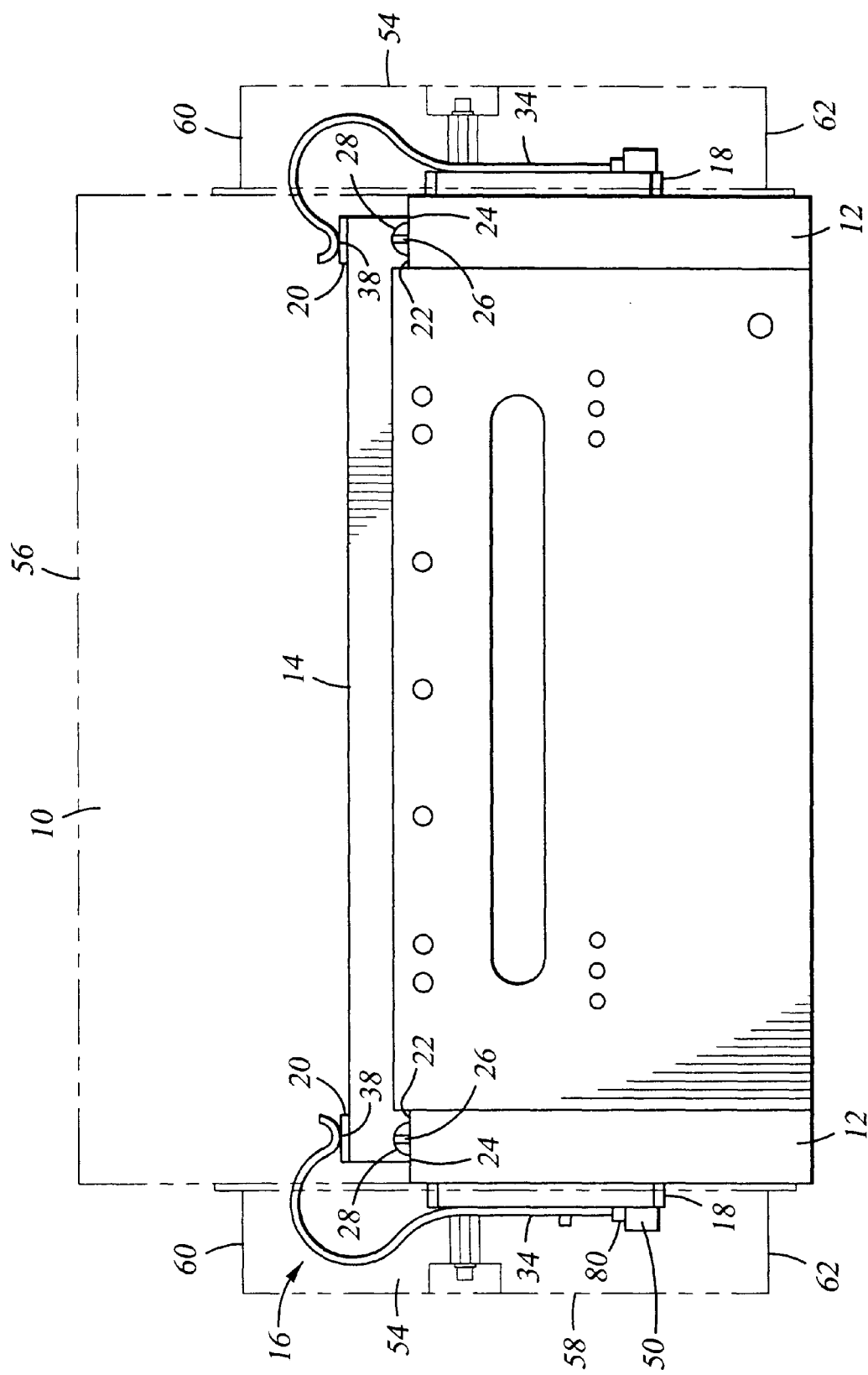
FIG. 1 is a cross sectional view of a processing chamber illustrating the relationship of the chamber walls and the lid and showing a fastener installed on the chamber in cooperation with a mounting plate and contact plate.

FIG. 1 is a cross sectional view of an SACVD processing chamber 10 illustrating the relationship of the chamber walls 12 and the chamber lid 14 and showing fastener 16 removably mounted on the chamber walls in cooperation with mounting plate 18 and contact plate 20. The chamber walls 12 have a sealing surface 22 that forms an airtight seal with a lower surface 24 of the lid 14 to form a vacuum processing chamber. It is preferred that an o-ring gasket 26 be positioned in a groove 28 provided therefore around the entire perimeter of the lid 14 to provide an airtight seal between the lid 14 and the chamber walls.

Figure 2:
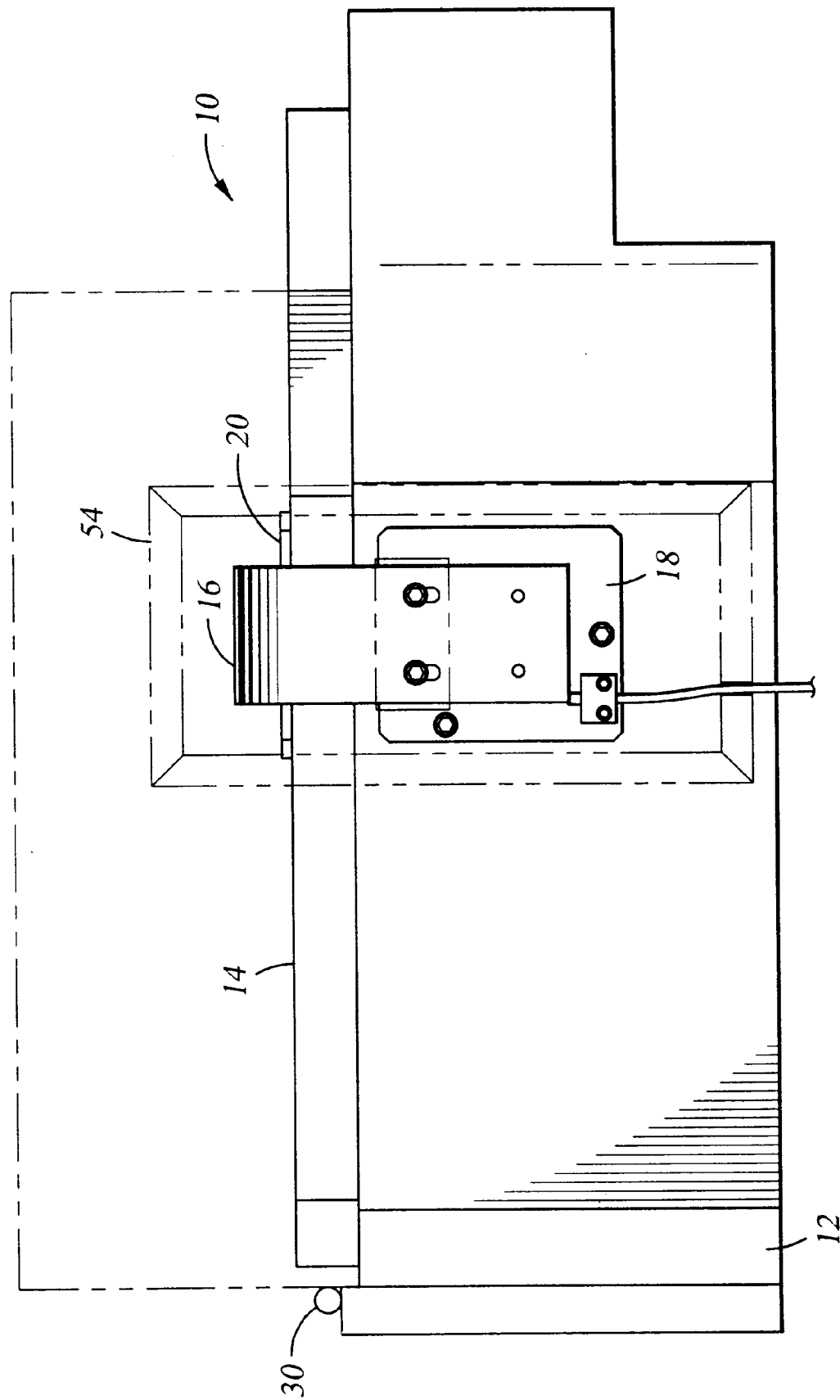
FIG. 2 is a side view of a processing chamber illustrating the hinge and fastener attachment to the chamber.

Referring to FIG. 2, a side perspective view of a processing chamber 10 is shown. The lid 14 is preferably attached to the chamber walls 12 by a hinge 30 to facilitate movement of the lid 14 relative to the chamber between an opened and closed position. The processing chamber 10 is typically operated at reduced or very low pressure so that the lid 14 and walls 12 of the chamber 10 are secured in an abutting engagement by the vacuum environment within the chamber 10. A fastening member 16 is employed to secure the lid 14 in the sealed, abutting relationship with the chamber walls for processing to prevent the lid 14 from being dislocated should the pressure in the chamber 10 suddenly increase. The fastening members 16 are typically located on the chamber walls 12 at positions located opposite the hinge member 30 to provide a desired securing force spaced about the perimeter of the chamber 10 and lid 14.

Figure 3:
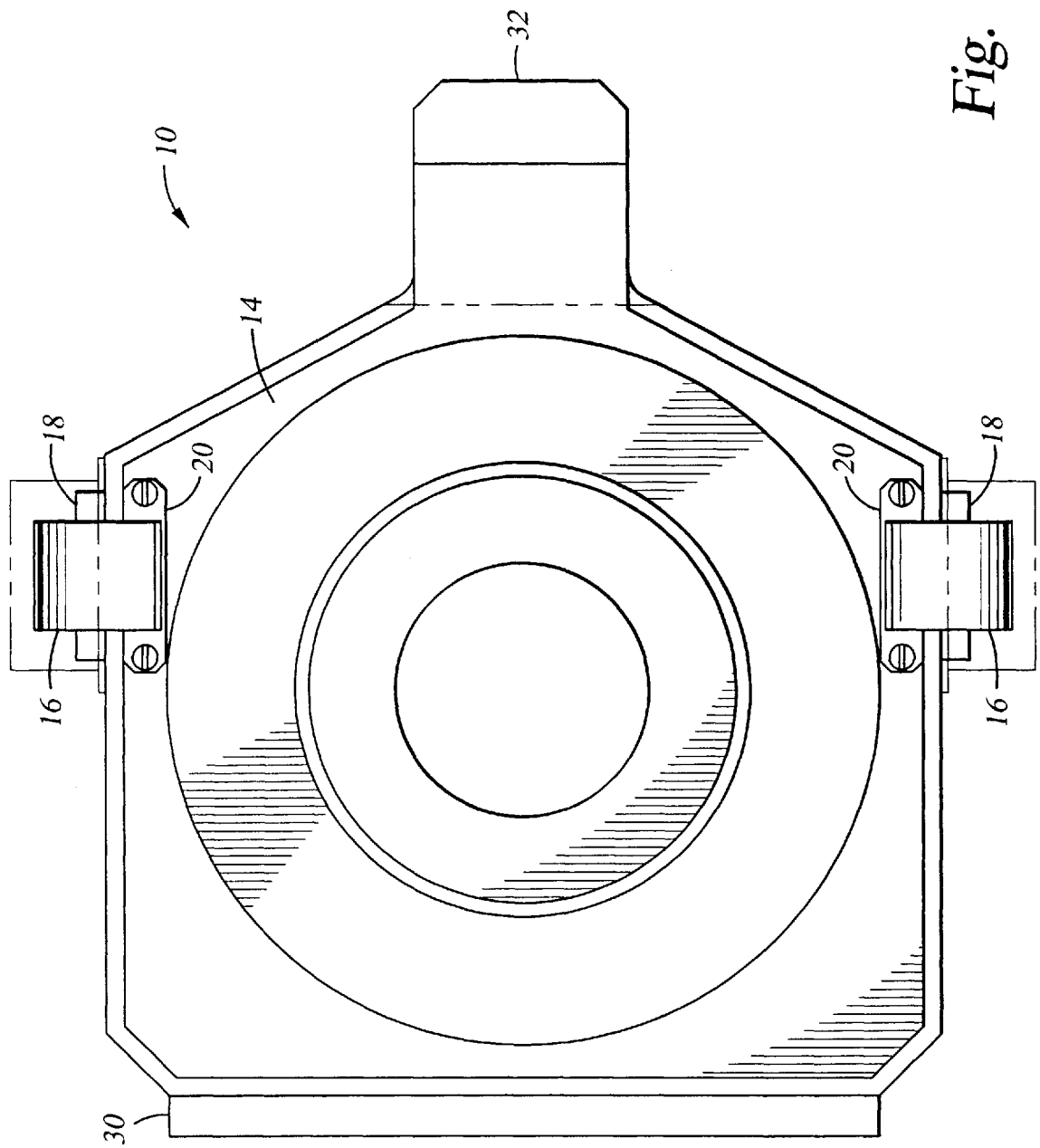
FIG. 3 is a top view of the processing chamber showing the chamber cover and the hinged attachment of the lid to the chamber walls.

FIG. 3 is a top view of the processing chamber 10 showing the chamber lid 14 and the hinged attachment 30 of the lid 14 to the chamber walls 12. The chamber lid 14 includes a handle 32 located opposite the hinge 30 of the lid 14 to enable the lid 14 to be opened and closed about the hinge 30 when the fastening members 16 are removed.

Description of One Embodiment of a Pressure Responsive Fastener

Figure 4:
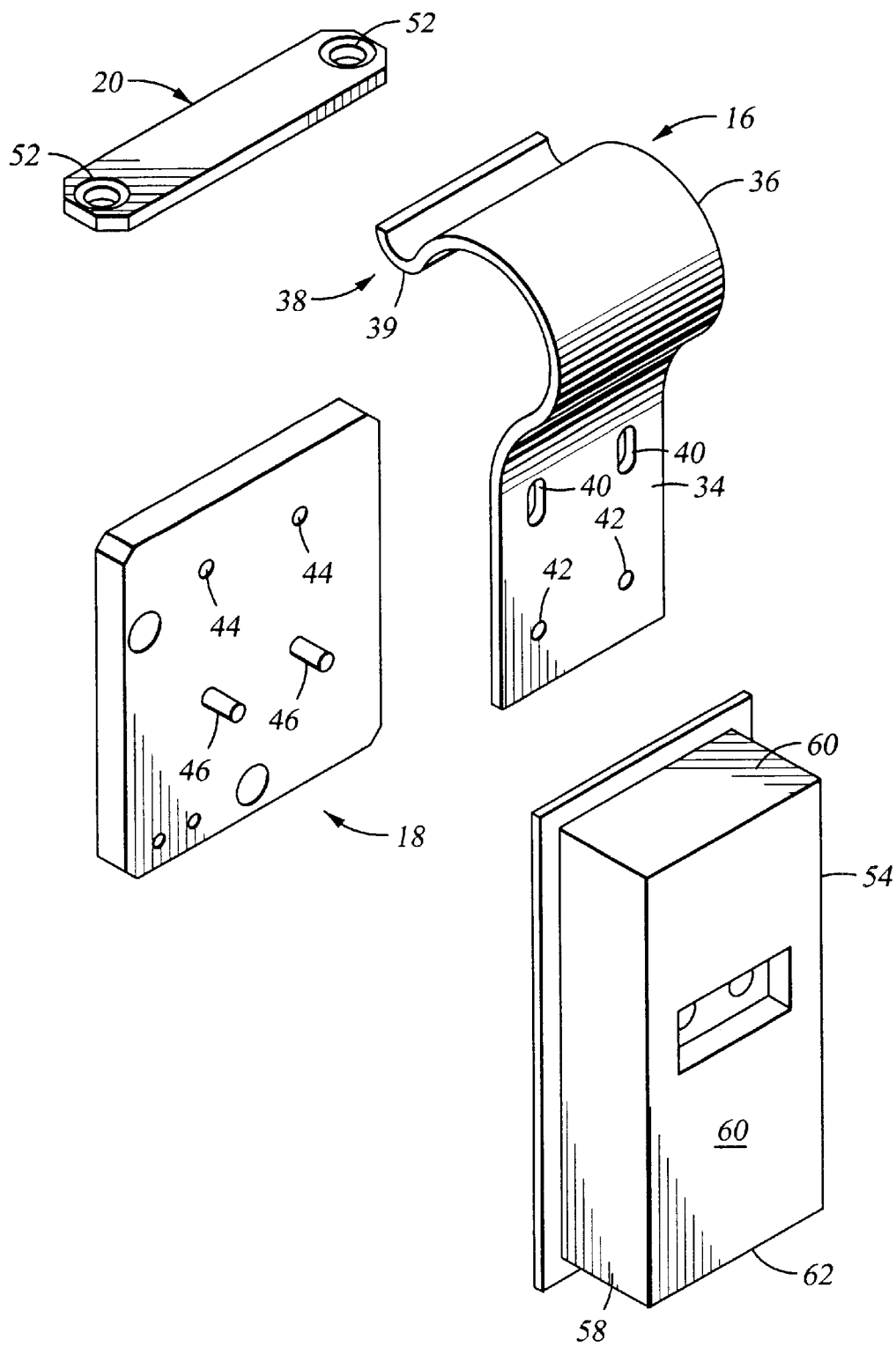
FIG. 4 is an exploded view of one embodiment of a fastener of the present invention.
Figure 5:
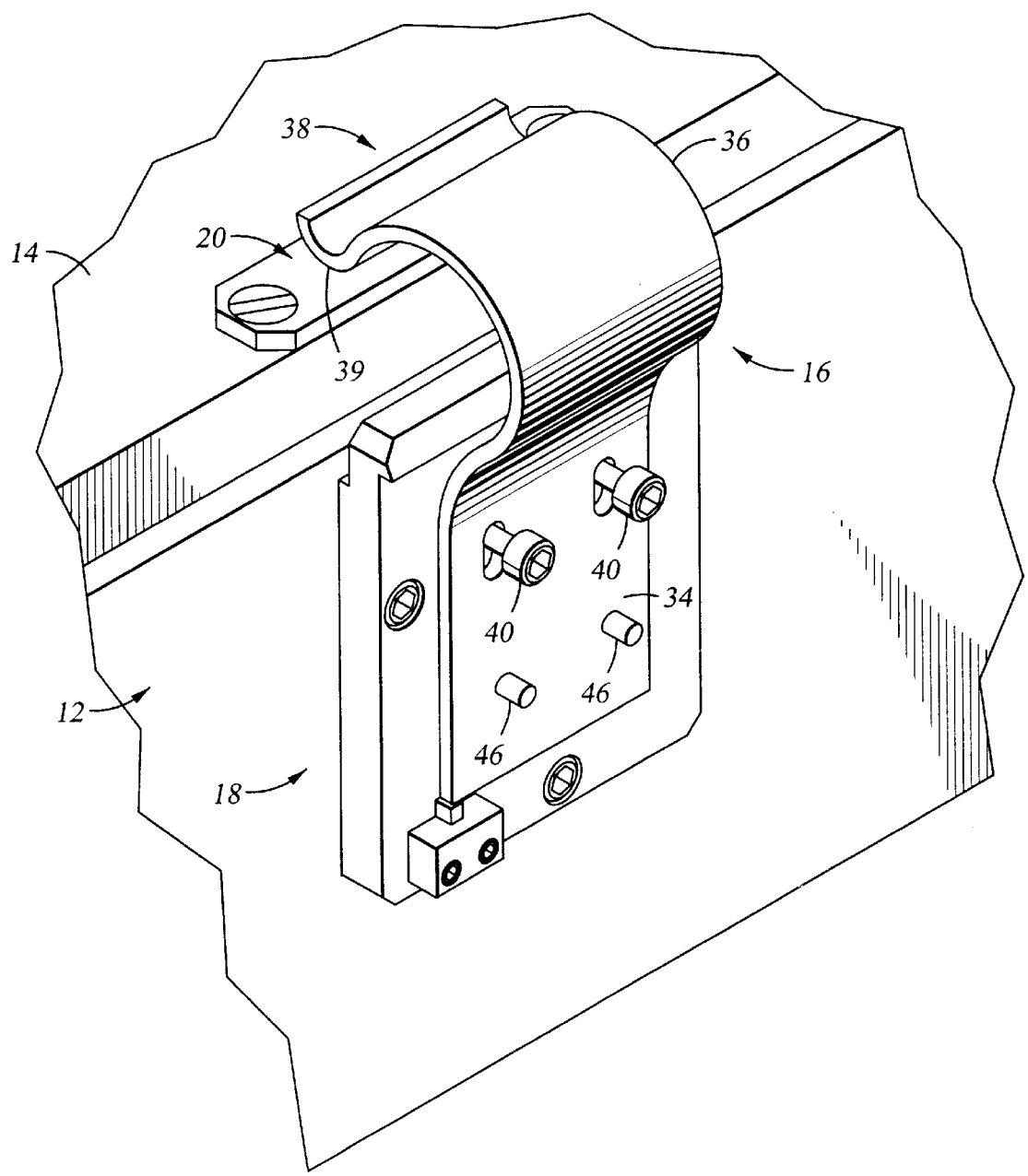
FIG. 5 is a perspective view of one embodiment of a fastener of the present invention shown in position on a chamber for processing.

FIG. 4 is an exploded view of one embodiment of a pressure responsive fastener 16 of the present invention. The fastener 16 generally has a staff shaped profile and a generally planar mounting portion 34, a semicircular deflectable portion 36 and a generally arcuate cover contact portion 38. The contact portion 38 is preferably upturned at its end to provide a smooth, substantially horizontal contact surface 39 to prevent particle generation between the contact surface 39 and chamber lid surface on which the contact surface is engaged during operation of the chamber.

Figure 6:
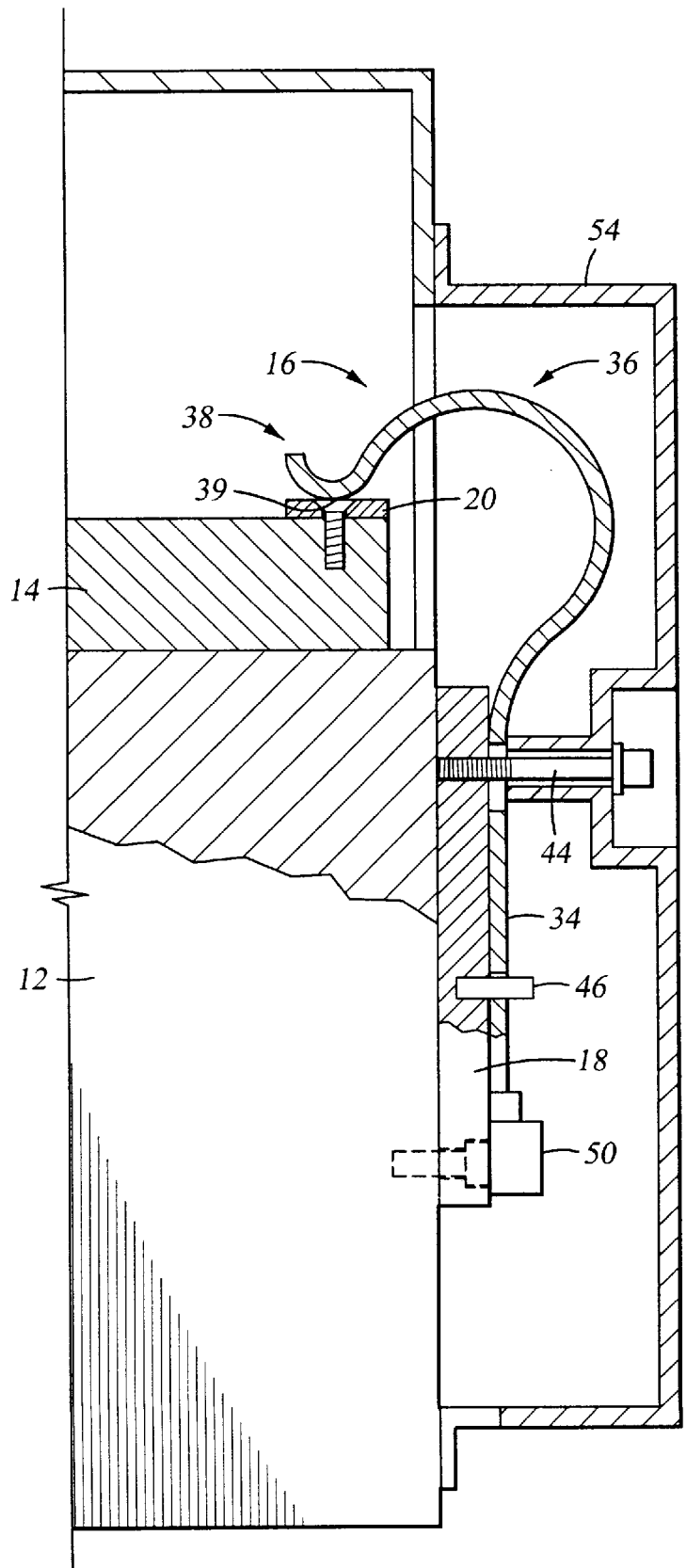
FIG. 6 is a cross sectional view of a fastener mounted on the chamber in position for processing.
Figure 7:
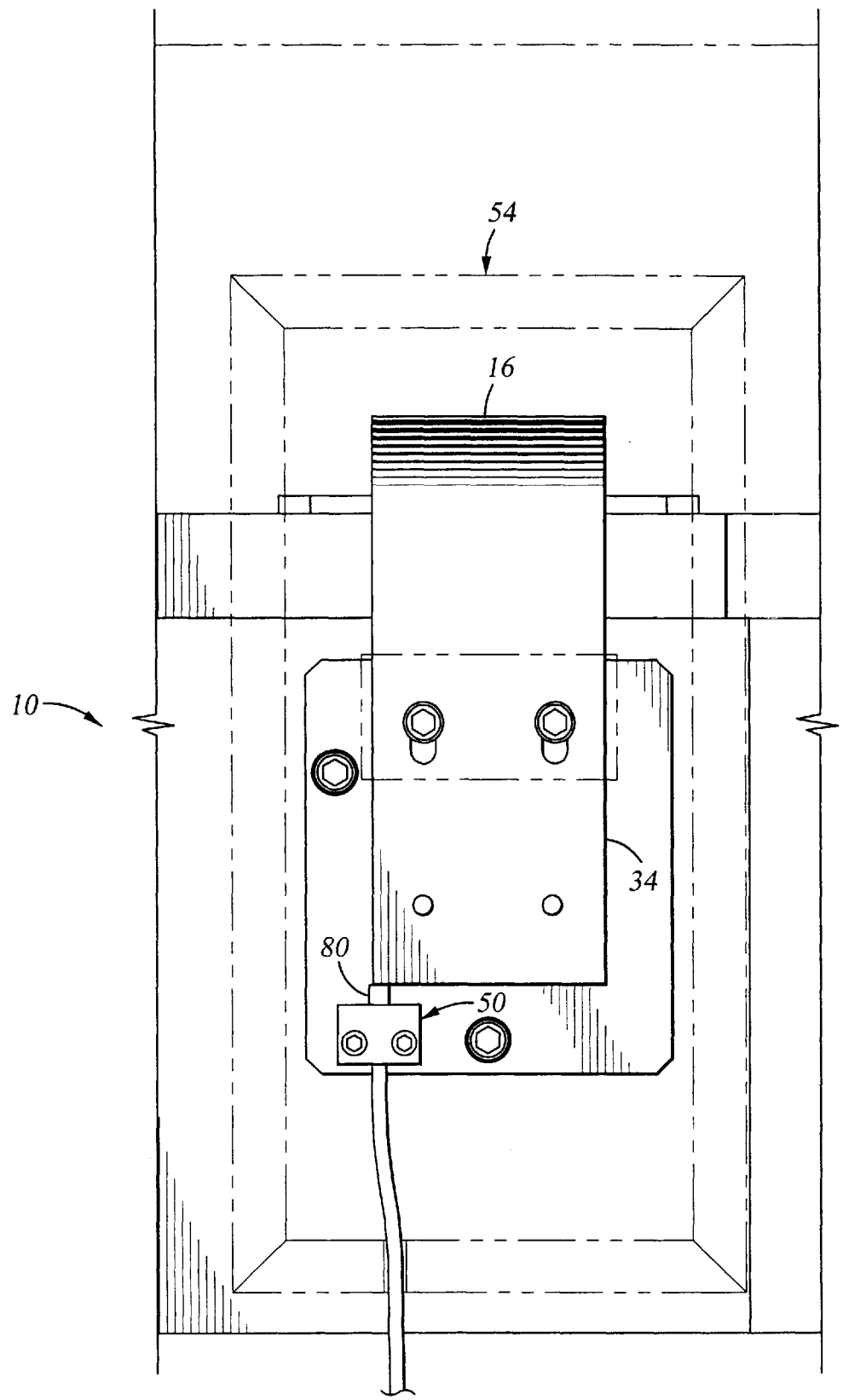
FIG. 7 is a front view of a fastener mounted on a chamber with the cover shown in phantom.

The fastener 16 is preferably mounted to the chamber 10 on mounting plate 18. The mounting portion 34 defines a plurality of recesses 40 therein in which are received screws for mounting the fastener 16 to the mounting plate 18 and a plurality of recesses 42 to receive alignment pins 46 extending radially from the mounting plate 18 (See FIG. 6) to reinforce the positioning of the fastener 16 on the chamber 10.

The deflecting portion 36 of the fastener 16 allows the lid 14 of the chamber 10 to separate from the walls 12 of the chamber if the pressure suddenly increases within the chamber to an unacceptable limit to burp the chamber. The deflecting portion 36 distributes the load of the forces acting on the hingedly attached lid 14 over the entire area of the deflecting portion 36. Further, the deflecting portion 36 of the fastener 16 acts as a spring to provide a selected amount of resistance to the chamber lid 14. The amount of resistance with which the fastener 16 secures the lid 14 in a sealed relationship with the chamber walls 12 can be determined by the size of the deflecting portion 36, the type of material from which the fastener is made and the thickness of at least the deflecting portion 36 of the fastener 16. Preferably, the deflecting portion 36 of the fastener 16 is sized to prevent plastic deformation of the deflecting portion 36 when the forces exerted from within the chamber exceed the maximum force with which the fastener 16 can maintain the lid 14 and chamber walls 12 in the sealed relationship.

Mounting of the Fastener to the Processing Chamber and Contact with the Chamber Lid The fastener is preferably mounted to the chamber 10 on a replaceable mounting plate 18 so that the surface of the chamber 10 is not compromised over time. A replaceable surface on the cover is preferably provided by a contact plate 20 to prevent erosion of the surface of the lid 14 caused by the fastener 16. FIG. 4 illustrates a mounting plate 18 and a contact plate 20 used in connection with a fastener of the present invention. The mounting plate 18 and contact plate 20 preferably provide a mounting surface and a contact surface on which the fastener 16 is mounted and in contact when in use, both of which are easily replaced if necessary. Mounting plate 18 is shown for mounting the base portion 34 on the wall 12 of the chamber 10 and receiving a fastener 16 thereon. The mounting plate 18 includes a plurality of recesses 44 in which are received screws to mount the fastener 16 to the mounting plate 18. The mounting plate 18 also includes a plurality of pins 46 extending radially therefrom which are received in recesses 42 defined therefor in the mounting portion 34 of the fastener 16 to reduce the stress applied to the mounting portion 34 and screws extending therethrough in the event of a sudden increase in pressure within the chamber 10. The pins 46 also facilitate alignment of the fastener 16 with the mounting plate 18 and the surfaces of the chamber on which the fastener 16 operates. The mounting plate and contact plate are preferably made of stainless steel which typically provides better wear resistance than aluminum (out of which the chamber is commonly fabricated).

Referring to FIGS. 2, 5–7, an electrical sensor 50 is located on mounting plate 18 to monitor the positioning of the fastener on the chamber. The sensor 50 is preferably located on the lower portion of the mounting plate 18 so that the fastener when positioned on the mounting plate 18 depresses a switch 80 located on the upper edge of the sensor 50 to indicate that the chamber is ready for operation. If the fastener 16 is not properly positioned on the chamber, the switch 80 on the sensor 50 will not be depressed and the chamber will be disabled. Preferably, any type of electrical sensor 50 is within the scope of the present invention, so long as the sensor is capable of preventing the operation of the chamber 10 when the lid 14 is not closed and the fastener 16 properly positioned on the mounting plate 18. One sensor used to advantage with the present invention is available from K Tec, model number E62-103.

Contact plate 20 for mounting on the lid 14 provides a contact surface for the cover contacting portion 38 of the fastener 16. The contact plate 20 provides a surface on which the cover contacting surface of the fastener 16 is in contact when positioned for processing. Preferably this contact plate 20 is secured to the lid 14 of the chamber 10 to provide a replaceable surface with which the fastener 16 is contactable when properly mounted on the chamber 10. The contact plate 20 defines a plurality of recesses 52, preferably two, through which screws are extended to secure the contact plate 20 to the chamber lid 14. Use of the contact plate 20 eliminates abrasion of the surface of the lid 14, which is typically aluminum, by the fastener 16 during repeated use of the fastener and provides a disposable or replaceable surface which can be easily replaced.

Relationship of the Fastener and Chamber Walls and Lid

Referring to FIGS. 1 through 3 preferably a pair of contact plates 20 and mounting plates 18 are mounted to the chamber lid 14 and walls 12, respectively, by screws. A hinge 30 and a pair of fasteners 16 mounted on the mounting plates 18 provide three points of retention spaced about the perimeter of the lid 14 to secure the lid 14 and chamber walls 12 in an abutting, sealed relationship. To mount the fasteners 16 in position for operation of the chamber, the chamber lid 14 is closed and the base portion 34 is positioned on the sensor 50 to depress the switch. The fastener is then rotated into position on the mounting plate 18 so that the alignment pins 46 extending radially from the mounting plate 18 are received in the recesses 42 of the fastener 16 so that the cover contacting portion 38 of the fastener contacts the contact plate 20 to secure the lid 14 in abutting engagement with the sealing surface 22 of the chamber walls 12 and the O-ring 26 disposed therebetween. Screws are inserted through recesses 40 in the base portion 34 of the fastener 16 and threaded into the recesses 44 of the mounting; plate 18 to secure the fastener 16 in position for processing. Once the fastener 16 is properly positioned, the circuit of the electrical sensor 50 (see FIG. 1) is completed and the processing chamber 10 is ready for operation.

Operation of a Safety Clamp

Once the chamber is operational, a vacuum environment is created within the chamber 10 by various pumping means such as a cryogenic pump, turbo pump, getter pump, etc. The lid 14 is secured in a sealed, abutting relationship with the upper surface 22 of the chamber walls 12 under vacuum pressure within the chamber. The fastener 16 need not play a significant role in forming the air tight seal between the lid 14 and the chamber walls 12 because the vacuum environment within the chamber secures the lid 14 to the chamber walls. However, the fastener contemplated by the present invention vents or burps the chamber in the event that the pressure within the chamber suddenly increases beyond an acceptable limit. The fasteners of the present invention allow the chamber lid 14 to open slightly in the event of a sudden increase in pressure to relieve pressure within the chamber and prevent damage to the chamber and chamber components.

A sudden change or increase in pressure within the chamber which exceeds the selected force up to which the clamp is able to maintain the lid 14 and chamber walls 12 in their sealed relationship forces the chamber lid 14 to separate from the chamber wills 12 thereby allowing the gases within the chamber to be vented. The hinge 30 is preferably sufficiently strong to prevent the portion of the lid 14 adjacent the hinge from lifting or separating from the chamber 10. Preferably, the fasteners 16 allow the chamber lid 14 to open slightly at a location typically opposite the hinge 30 to relieve the pressure in the chamber 10. The design of the fastener 16 allows the lid to separate from the chamber walls 12 a distance sufficient to accomplish venting and then return to a normal state without residual plastic deformation of the deflecting portion 36.

Protective Cover Housing the Clamp

A cover 54 preferably mounts on the chamber 10 to confine the RF energy from escaping into the surrounding work environment. The cover 54 may be attached to the fastener 16, the chamber walls 12, or the chamber cover 56 which typically is provided over the lid 14 of the chamber 10. The combination of the two covers 54, 56 provides a casing in which any RF energy which escapes from the chamber when the lid 14 separates from the chamber walls 12 in the event of a sudden increase in pressure within the chamber is confined. The covers 54, 56 are preferably made of a dielectric material such as ceramic to prevent conduction of a current therethrough should any RF energy escape from the chamber 10.

Referring to FIG. 4, a fastener cover 54 is shown having side walls 58 and top 60 to cover the fastener 16. The size of the fastener cover 54 is selected so that the lower wall 62 of the cover and the top 60 are slightly larger than the potential displacement of the fastener 16 under pressure.

Preferably, the clamp cover 54 is mounted to the lid cover 56 of the chamber so that displacement or separation of the lid 14 from the chamber walls 12 on pressure excursion within the chamber 10 does not affect the position of the covers 54, 56 relative to the chamber 10, chamber lid 14 and fastener 16. The two covers thereby provide a housing within which RF energy can be contained should the pressure within the chamber exceed the selected pressure range to cause separation of the lid 14 from the chamber walls 12 to vent the chamber 10.

Examples of Tests Conducted Using One Embodiment of a Safety Clamp and a Simulated Explosion A shock test was performed using an apparatus of the present invention and an Impact Type Shock Machine with an opposing force gas cylinder. This machine has the ability to simulate overload up to 210 g's in the time range of 0.1 to 0.3 milliseconds that corresponds to possible chemical explosions inside the processing chamber. Results of the tests conducted on the clamps are as follows:

| Applied Force/lb. psi | Deflection/in. |
| --- | --- |
| 515 | 0.122 |
| 518 | 0.118 |
| 545 | 0.128 |
| 1000 | 0.350 |
| 1100 | 0.375 |
| Acceleration/g's | |
| 150 | .200 |
| 165 | .200 |
| 210 | .280 |

The spring deflection occurring during the shock test was measured as a length of scriber traces on the side surface of the chamber dummy.

The dummy mass was approximately 8.9 lbs. Calibration data for the accelerometer with built-in electronics was as follows:

| Voltage sensitivity | Range |
| --- | --- |
| 9.8 mV/g | 500 g's |

The results obtained in the above-identified tests indicate that the embodiment of the fastener which was tested provided deflection within tolerable limits for pressures applied to the lid ranging from 515 lb/psi–1100 lb/psi without causing plastic deformation of the clamp. Therefore, it is believed by the inventors that the fastener tested can withstand any force which may result within a processing chamber and provide the necessary deflection to vent or burp the chamber without resulting in plastic deformation of the clamp.

While the foregoing is directed to the preferred embodiment of the present invention, other and further embodiments of the invention may be devised without departing from the basic scope thereof The scope of the invention is determined by the claims which follow.

We claim:

1. An apparatus for securing a cover on a processing chamber and for controllably releasing pressure within the chamber, comprising:

at least one clamp positioned along an edge of the cover, the clamp comprising:
   i) a base portion having a removable fastener for fastening the clamp to an exterior surface of the processing chamber;
   ii) a cover contacting portion for securing the cover to the chamber; and
   iii) a deflectable portion disposed between the base portion and the cover contacting portion; and a hinge member coupling the cover to the processing chamber.

2. The apparatus of claim 1 wherein the base portion, cover contacting portion and deflectable portion form a unitary structure.

3. The apparatus of claim 1 further comprising:
a) a mounting plate attached to an exterior surface of the processing chamber for receiving the base portion of the clamp; and
b) a contact plate attached to the cover for engaging the cover contacting portion.

4. The apparatus of claim 3 wherein the mounting plate includes a plurality of positioning pins extending radially therefrom, and wherein the base portion of the clamp includes a plurality of positioning holes for mating with the positioning pins to align the clamp on the chamber so that the cover contacting portion of the clamp contacts the contact plate of the cover.

5. The apparatus of claim 1 wherein the deflectable portion is a spring.

6. A semiconductor processing apparatus, comprising:
a processing chamber having an opening therein;
a cover for sealing the opening;
a hinge coupling the processing chamber to the cover;
a clamp for regulating pressure in a chamber releasably securing the cover to the opening, the clamp comprising:
i) a base portion having a fastener for disconnectably connecting the base portion to an exterior surface of the processing chamber;
ii) a cover contacting portion for securing the cover to the chamber; and
iii) a deflectable portion disposed between the base portion and the cover contacting portion to enable controlled separation of the cover from the chamber;
a mounting plate attached to an exterior surface of the processing chamber for receiving the base portion of the clamp; and
a contact plate attached to the cover for engaging the cover contacting portion.

7. The processing system of claim 6 wherein the deflectable portion provides controlled displacement of the cover contacting portion from a first position providing a sealing relationship between the cover and the processing chamber to a second position allowing a nonsealing relationship between the cover and the processing chamber.

8. The processing system of claim 7 wherein the nonsealing relationship between the cover and the processing chamber is achieved when the cover contacting portion receives a force from the cover in a selected pressure range.

9. The processing system of claim 8 wherein the pressure range is from about 500 lbs. to about 1500 lbs.

10. The processing system of claim 6 wherein the mounting plate includes a plurality of positioning pins, and wherein the base portion of the clamp includes a plurality of positioning holes for mating with the positioning pins to align the cover contacting portion of the clamp with the contact plate of the cover.

11. The apparatus of claim 3, further comprising an electrical sensor attached to the mounting plate to monitor the positioning of the apparatus on the processing chamber.

12. The apparatus of claim 6, further comprising an electrical sensor attached to the mounting plate to monitor the positioning of the clamp on the processing chamber.

13. The apparatus of claim 6, wherein the base portion, cover contacting portion and deflectable portion form a unitary structure.

14. An apparatus for securing a cover on a processing chamber and for controllably releasing pressure within the chamber, comprising:
at least one clamp positioned along an edge of the cover, the clamp comprising:
i) a base portion having a removable fastener for fastening the clamp to an exterior surface of the processing chamber;
ii) a cover contacting portion for securing the cover to the chamber; and
iii) a deflectable portion disposed between the base portion and the cover contacting portion; and
a mounting plate attached to an exterior surface of the processing chamber for receiving the base portion of the clamp; and
a contact plate attached to the cover for engaging the cover contacting portion.

15. The apparatus of claim 14 wherein the base portion, cover contacting portion and deflectable portion form a unitary structure.

16. The apparatus of claim 14 wherein the mounting plate includes a plurality of positioning pins extending radially therefrom, and wherein the base portion of the clamp includes a plurality of positioning holes for mating with the positioning pins to align the clamp on the chamber so that the cover contacting portion of the clamp contacts the contact plate of the cover.

17. The apparatus of claim 14 wherein the deflectable portion is a spring.

18. The apparatus of claim 14, further comprising an electrical sensor attached to the mounting plate to monitor the positioning of the apparatus on the processing chamber.

* * * * *

UNITED STATES PATENT AND TRADEMARK OFFICE
CERTIFICATE OF CORRECTION

PATENT NO. : 6,012,600
DATED : January 11, 2000
INVENTOR(S) :
    Pham et al.

It is certified that error appears in the above-identified patent and that said Letters Patent is hereby corrected as shown below:

In column 4, line 39, after " a " , please replace " substrates" with " substrate" .

In column 6, line 66, after " mounting" , please delete " ;" .

In column 7, line 26, after " chamber" , please replace " wills" with " walls" .

Signed and Sealed this

Thirtieth Day of January, 2001

Attest:

Q. TODD DICKINSON

*Attesting Officer*  *Director of Patents and Trademarks*